US007810527B2

(12) United States Patent
Mouchelet et al.

(10) Patent No.: US 7,810,527 B2
(45) Date of Patent: Oct. 12, 2010

(54) CONTAINER-TREATMENT MACHINE COMPRISING CONTROLLED GRIPPING MEANS FOR SEIZING CONTAINERS BY THE NECK

(75) Inventors: Marc Mouchelet, Octeville sur Mer (FR); Laurent Danel, Octeville sur Mer (FR); Yves-Alban Duclos, Octeville sur Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 917 days.

(21) Appl. No.: 11/628,748

(22) PCT Filed: Jun. 22, 2005

(86) PCT No.: PCT/EP2005/052904

§ 371 (c)(1),
(2), (4) Date: Feb. 8, 2007

(87) PCT Pub. No.: WO2006/000561

PCT Pub. Date: Jan. 5, 2006

(65) Prior Publication Data

US 2007/0240783 A1    Oct. 18, 2007

(30) Foreign Application Priority Data

Jun. 24, 2004    (FR) .................................. 04 51327

(51) Int. Cl.
*B65B 43/42* (2006.01)
(52) U.S. Cl. ........................ 141/165; 141/177; 141/368; 141/369; 141/372

(58) Field of Classification Search .................... 141/57, 141/165, 177, 368, 369, 370, 371, 372; 427/38, 427/237, 238, 294; 118/724
See application file for complete search history.

(56) References Cited

U.S. PATENT DOCUMENTS

| 3,856,059 | A | * | 12/1974 | Hartness et al. ............. 141/165 |
| 4,746,538 | A | * | 5/1988 | Mackowski ................. 427/577 |
| 5,301,725 | A | * | 4/1994 | Meinzinger ................. 141/372 |
| 6,242,053 | B1 | | 6/2001 | Anderle et al. |
| 6,276,296 | B1 | * | 8/2001 | Plester .................... 118/723 R |
| 2003/0217527 | A1 | | 11/2003 | Luttringhaus-Henkel et al. |

FOREIGN PATENT DOCUMENTS

FR    2783667    3/2000

* cited by examiner

*Primary Examiner*—Timothy L Maust
(74) *Attorney, Agent, or Firm*—Young & Thompson

(57) ABSTRACT

A machine for the treatment of containers (12) provided with a neck (14), includes at least one, treatment station provided with a nipple (22) having gripping elements (26) in order to seize a container (12), the gripping elements (26) including a tubular supporting cuff (50) which is provided with a series of radial drillholes (52), each intended for receiving a ball (54) movable radially between an inner gripping position and an outer release position, characterized in that the gripping elements (26) include a tubular control cuff (56) which is mounted slideably between a locked position, in which a frustoconical bearing surface (58) cooperates with the balls (54) in order to stress them toward their gripping position, and an unlocked axial position, and in that the nipple (22) includes controlled drive elements (62) capable of causing the sliding of the control cuff (56).

12 Claims, 5 Drawing Sheets

CONTAINER-TREATMENT MACHINE COMPRISING CONTROLLED GRIPPING MEANS FOR SEIZING CONTAINERS BY THE NECK

BACKGROUND OF THE INVENTION.

The present invention relates to a machine for the treatment of containers provided with a neck, such as bottles, flasks or the like.

The present invention relates more particularly to a machine for the treatment of containers of the abovementioned type by the depositing of a barrier-forming internal coating by means of a microwave plasma, especially for the purpose of allowing the packaging of oxidation-sensitive liquids in the containers, said machine comprising at least one treatment station for a container provided with a neck, each treatment station comprising a nipple which comprises gripping means for seizing the container externally by its neck and means for connecting the interior of the container to a vacuum-pumping circuit in a leaktight manner, said machine being of the type in which the nipple is mounted slideably along a substantially vertical axis with respect to a treatment enclosure between an axial transfer position and an axial treatment position, so as to allow the axial insertion of the container into the enclosure via a corresponding aperture, the nipple comprising an annular closing portion which comes to bear axially against a corresponding portion of the enclosure in a leaktight manner in order to close said aperture of the latter, said machine being of the type in which the gripping means comprise a tubular supporting cuff which is coaxial with respect to the neck of the container and is fixed in relation to the nipple and which is provided with a series of open-ended radial drillholes, each intended for receiving a ball movable radially between an inner gripping position, in which the ball cooperates with the neck in order to seize the container, and an outer release position.

In this type of machine, the container is generally arranged right way up, that is to say with the neck directed upward, the nipple sliding axially from the top downward in order to seize the container, during a gripping phase, and to bring it into the enclosure and from the bottom upward in order to remove the container and to release it, during a release phase.

The balls mounted in the nipple are stressed radially against the neck of the container by means of an O-ring made from elastic material.

With a nipple equipped with such a type of gripping means, the gripping of the container takes place by force fitting in the following way. During the gripping phase, the nipple exerts an axial force on the container from the top downward, in order to repel the balls radially outward, counter to the elastic return force applied to the balls by the O-ring, so as to allow the insertion of the neck of the container into the nipple.

The container is then seized by its neck by means of the balls which exert a radial bearing force against the neck under the stress of the O-ring.

Similarly, the release of the container takes place by force unfitting. During the release phase, the container is retained axially downward by an element which comes to bear axially against a shoulder of the container, so as to repel the balls outward and so as to allow the axial withdrawal of the nipple upward in relation to the container, counter to the elastic return force applied to the balls by the O-ring.

This type of gripping means has disadvantages since it generates relatively high forces on the container during the gripping phase and during the release phase.

Moreover, when the container is seized by the neck, the balls apply a radial bearing force to the convex axial wall of the neck, and this may damage the neck.

The present invention is aimed particularly at overcoming these disadvantages.

SUMMARY OF THE INVENTION.

For this purpose, the invention proposes a treatment machine of the type described above, characterized in that the gripping means comprise a tubular control cuff which is coaxial and external with respect to the supporting cuff and which is mounted axially slideably with respect to the supporting cuff between a locked axial position, in which a frustoconical bearing surface arranged on the concave axial wall of the control cuff cooperates with the balls in order to stress them radially toward their gripping position, and an unlocked axial position, in which the balls are free to be displaced toward their release position, and in that the nipple comprises controlled drive means capable of causing the axial sliding of the control cuff toward at least one of its two specific axial positions.

According to other characteristics of the invention

- the gripping means comprise at least one elastic return element which stresses the control cuff toward its locked position, and the drive means are intended to cause the sliding of the control cuff from its locked position toward its unlocked position counter to the return element;
- the return element is interposed axially between the control cuff and the supporting cuff;
- the drive means comprise a pneumatic or hydraulic jack which is provided with a piston connected axially slideably to the control cuff, at least in the unlocking direction;
- the piston consists of a tubular cuff which is coaxial and external with respect to the control cuff and which comprises a radial surface bearing axially against an associated radial bearing surface of the control cuff;
- the control cuff is assembled on the supporting cuff provided with the balls, so as to form an interchangeable subassembly;
- with the nipple being carried by a cover which is mounted axially slideably with respect to the enclosure and which comprises an upper cap and a lower cap, the supporting cuff comprises, at its axial end opposite the neck, an outer radial collar which is clamped axially between the upper cap and the lower cap of the cover, so as to retain the interchangeable subassembly on the cover;
- the leaktight connection means comprise a substantially tubular cartridge which is coaxial with respect to the neck of the container and is mounted in the cover and which is provided, at one of its axial ends, with an annular seal, and the concave axial wall of the supporting cuff comprises a shoulder which is intended to come to bear axially against the annular seal;
- the neck of the container comprises an outer radial collar, and, when the balls are displaced radially toward their gripping position, they cooperate with the outer radial collar so as to stress the container axially toward the annular seal.

BRIEF DESCRIPTION OF THE DRAWINGS.

Other characteristics and advantages of the invention will become apparent from a reading of the following detailed description, to understand which reference will be made to the accompanying drawings in which.

DESCRIPTION OF PREFERRED EMBODIMENTS

Figure 1:
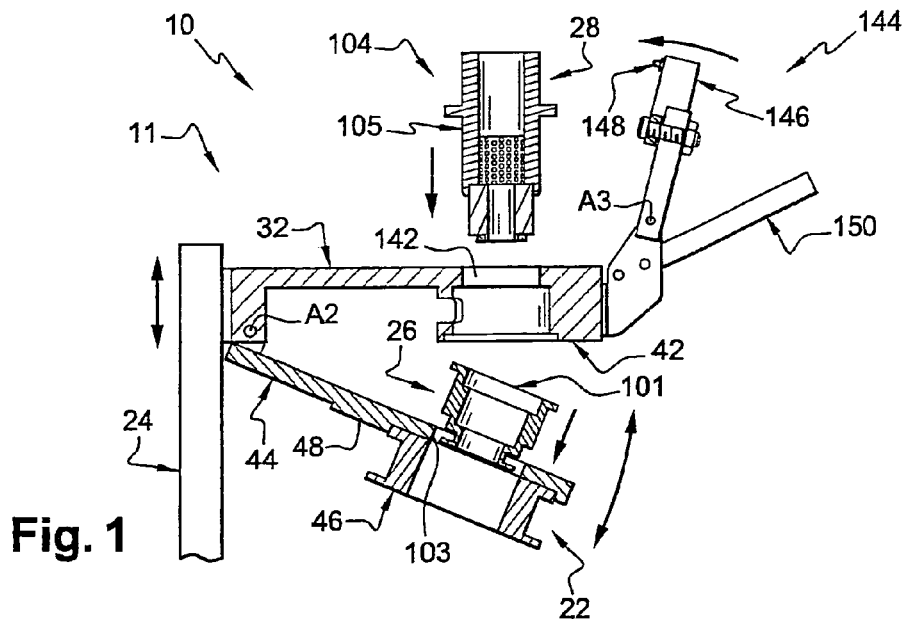
FIG. 1 is an exploding view in partial axial section which illustrates diagrammatically a treatment station of the machine according to the invention when the cover occupies a high axial transfer position with respect to the frame.

In the following description, identical, similar or like elements will be designated by the same reference numerals.

FIG. 1 partially illustrates a machine 10 for the treatment of containers 12, here bottles, which is implemented according to the teachings of the invention.

The machine 10 is aimed at carrying out the depositing of a barrier-forming internal coating by means of a microwave plasma, especially for the purpose of allowing the packaging of an oxidation-sensitive liquid in the containers 12.

Conventionally, the machine 10 comprises a plurality of treatment stations 11 which may be circumferentially distributed uniformly on a rotary support (not illustrated), each treatment station 11 being intended for treating one container 12 at a time.

These figures partially illustrate a single treatment station 11.

Figure 3:
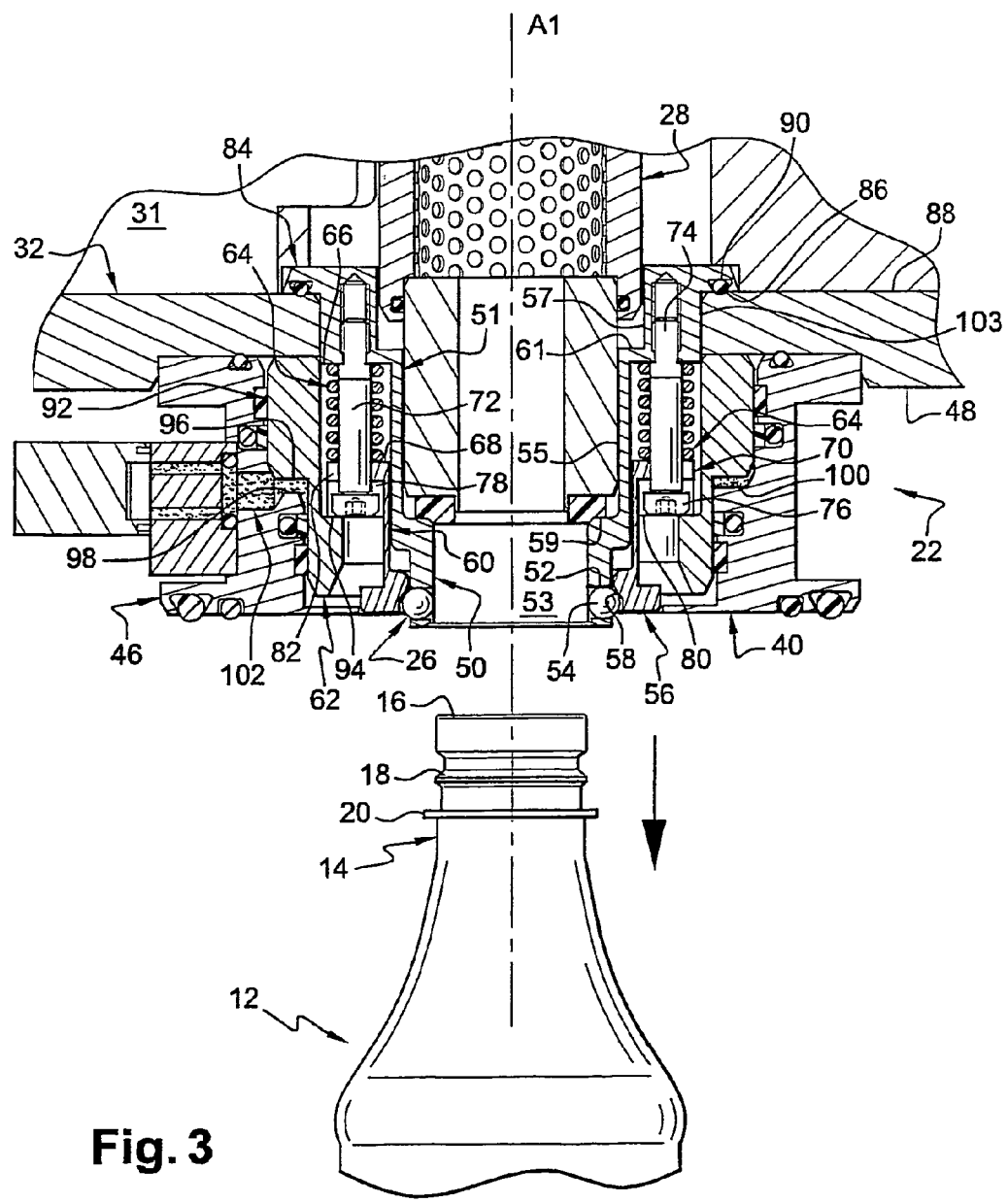
FIG. 3 is a view in axial section which partially illustrates the cover when the gripping means are ready to seize the neck of the container.

As may be seen particularly in FIG. 3, each container 12 is provided, at its upper axial end, with a neck 14 which delimits an upper aperture, the rim of which forms the lip 16 of the container 12.

The neck 14 is provided with a first outer radial collar 18 and with a second outer radial collar 20 arranged under the first outer radial collar 18.

Advantageously, when the container 12 is a bottle, the first outer radial collar 18 may consist of a tamper-proof ring which is generally present on the neck of the bottle and is intended for cooperating with a tamper-proof ferrule present on the stopper, and which tears when the container is opened.

Each treatment station 11 comprises a nipple 22 of substantially cylindrical shape which is mounted slideably along an axis A1, called a sliding axis and substantially vertical with respect to a fixed frame 24, of the machine 10.

In the rest of the description, a vertical axial orientation along the sliding axis A1 will be used in a nonlimiting way, this corresponding to an orientation from the top downward in the figures.

Elements will be designated as radial or as transverse as a function of their arrangement with respect to the sliding axis A1.

The nipple 22 comprises gripping means 26 for seizing the container 12 externally by its neck 14 and connection means 28 for connecting the interior of the container 12 to a vacuum-pumping circuit 30 in a leaktight manner.

Figure 4:
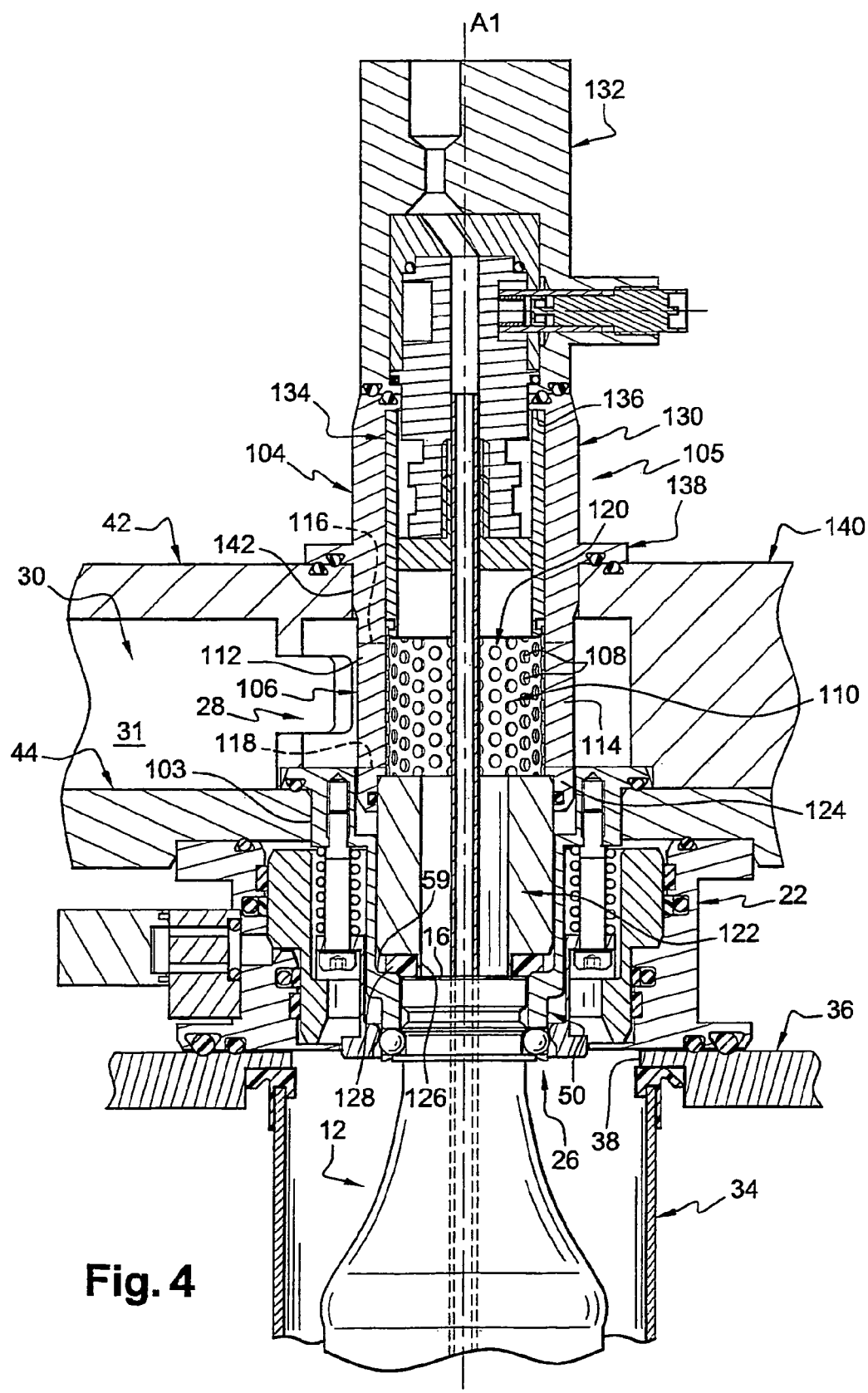
FIG. 4 is a view in axial section which partially illustrates the cover equipped with a cartridge and with an acetylene injector when the cover occupies its low treatment position and when it closes the treatment enclosure, a container being seized by the gripping means.

According to the embodiment illustrated here, the nipple 22 is carried by a cover 32, and the cover 32 is mounted axially slideably on the frame 24 between a high transfer position, which is illustrated in FIGS. 1 and 3, and a low treatment position, which is illustrated in FIG. 4.

The figures illustrate a portion of the pumping circuit 30 which consists of a pumping chamber 31 arranged inside the cover 32 and intended to be connected to the container 12 by the connection means 28.

Each treatment station 11 also comprises a treatment enclosure 34 which is fastened on the frame 24.

The treatment enclosure 34 comprises, in a portion 36 formed here by its upper transverse face, an aperture 38 which is intended to allow the axial insertion of the container 12 into the treatment enclosure 34.

The nipple 22 comprises an annular closing portion 40 which is intended to come to bear axially in a leaktight manner against said corresponding portion 36, formed here by the upper transverse face of the treatment enclosure 34, so as to close said aperture 38.

Figure 2:
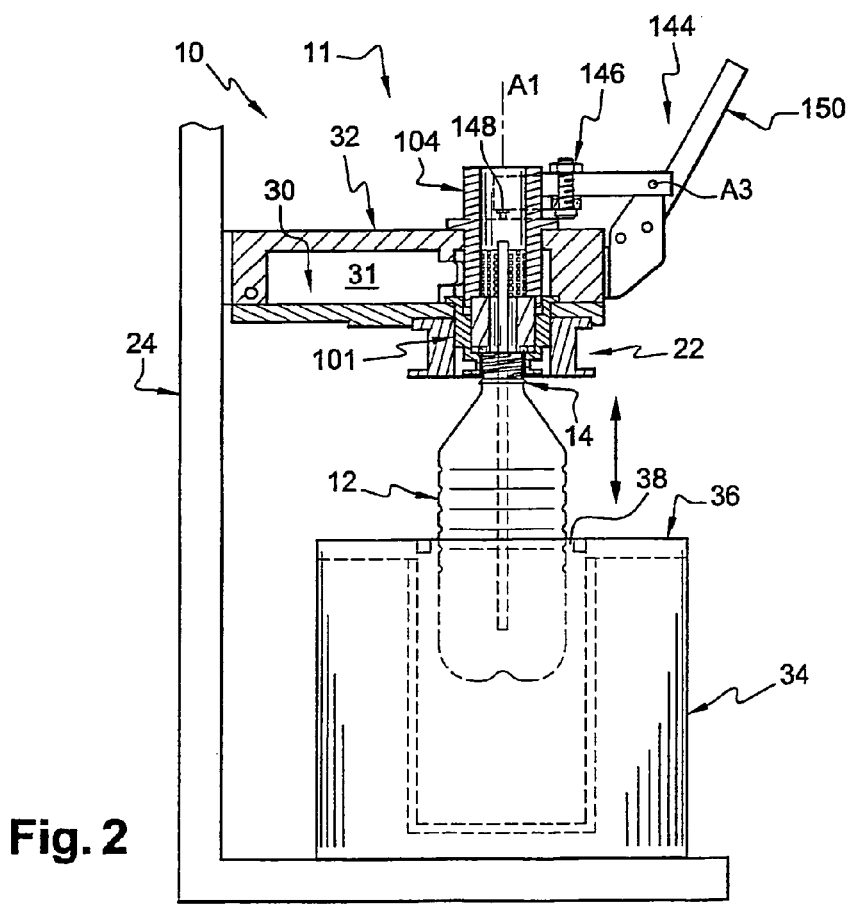
FIG. 2 is a view, similar to the preceding view, which illustrates diagrammatically the cover in an intermediate axial position when a container is seized by gripping means and partially introduced into a treatment enclosure.
Figure 5:
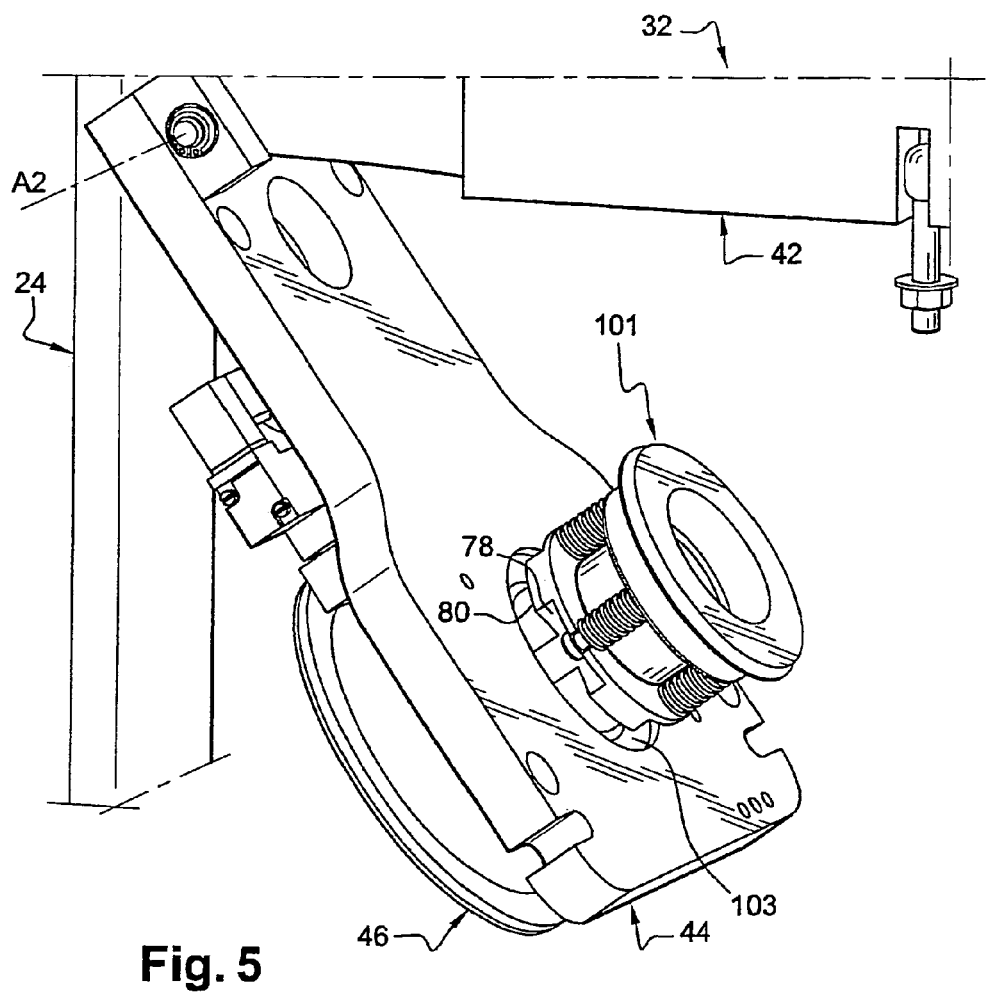
FIG. 5 is a perspective view which partially illustrates the lower cap of the cover in the downwardly tilted position, the subassembly which forms the gripping means being partially fitted in its receptacle.

The cover 32 comprises, here, an upper cap 42, which is mounted slideably on the frame 24, and a lower cap 44, which is mounted pivotably about a transverse axis A2 with respect to the upper cap 42, between an open demounting position, which is illustrated in FIGS. 1 and 5, and a closed position of use, which is illustrated particularly in FIG. 2.

The use of the demounting position will be explained later.

The nipple 22 comprises a substantially cylindrical annular main body 46 which is fastened at its upper axial end to the lower transverse face 48 of the cover 32.

The lower transverse end face of the main body 46 forms, here, the annular closing portion 40 of the nipple 22.

The gripping means 26 comprise a supporting cuff 50 which is tubular and coaxial with respect to the neck 14 of the container 12, fixed with respect to the main body 46 of the nipple 22, and which is provided with a series of open-ended radial drillholes 52, each intended for receiving a ball 54 movable radially between an inner gripping position, which is illustrated in FIG. 4, and an outer release position, which is illustrated in FIG. 3.

The radial drillholes 52 are of substantially cylindrical shape here and they each form a receptacle for a ball 54.

Preferably, the radial drillholes 52 are arranged in the vicinity of the lower axial end of the supporting cuff 50, and they are distributed angularly in a uniform way.

When the balls 54 occupy their inner radial gripping position, they are intended for cooperating with the neck 14 of the container 12 so as to seize the container 12.

When the balls 54 occupy their outer radial release position, they are intended to allow the withdrawal of the container 12 with respect to the nipple 22.

According to the embodiment illustrated here, the concave axial wall 51 of the supporting cuff 50 is stepped axially so that it comprises a cylindrical lower axial end portion 53, a cylindrical intermediate portion 55 and a cylindrical upper axial end portion 57 which are adjacent and which have respective inside diameters increasing upward.

The cylindrical lower axial end portion 53 delimits with the cylindrical intermediate portion 55 a shoulder 59 oriented upward.

The cylindrical intermediate portion 55 delimits with the cylindrical upper axial end portion 57 a radial surface 61 oriented upward.

Advantageously, the axial dimension of the cylindrical lower axial end portion 53 is substantially equal to the axial dimension of the neck 14 of the container 12 from the second outer radial collar 20 as far as the lip 16, so that, when the container 12 is seized by the gripping means 26, the lip 16 is arranged substantially at the same height as the shoulder 59, and so that the balls 54 cooperate by contact with the first outer radial collar 18 for the purpose of stressing the container 12 axially upward.

According to the teachings of the invention, the gripping means 26 comprise a control cuff 56 which is tubular and coaxial and external with respect to the supporting cuff 50.

This control cuff 56 is mounted axially slideably with respect to the supporting cuff 50 between a locked lower axial position, which is illustrated in FIG. 4, and an unlocked upper axial position, which is illustrated in FIG. 3.

The control cuff 56 comprises a frustoconical bearing surface 58 which is arranged on its concave axial wall 60 and which is intended for cooperating with the balls 54 so as to stress them radially toward their gripping position when the control cuff 56 slides from its unlocked position toward its locked position.

Conversely, when the control cuff 56 occupies its unlocked position, the balls 54 are free to be displaced radially between their gripping position and their release position.

According to another characteristic of the invention, the nipple 22 comprises controlled drive means 62 capable of causing the axial sliding of the control cuff 56 toward at least one of its two specific axial positions, that is to say the locked axial position and the unlocked axial position.

Advantageously, the gripping means 26 comprise at least one elastic return element 64 which stresses the control cuff 56 axially toward its locked position.

The drive means 62 are intended to cause the sliding of the control cuff 56 from its locked position toward its unlocked position counter to the elastic return element 64.

According to the embodiment illustrated here, the gripping means 26 comprise a plurality of elastic return elements 64 consisting of helical compression springs 64.

The springs 64 are angularly distributed uniformly, and they are interposed axially between a downwardly oriented annular radial surface 66 of the supporting cuff 50 and a confronting annular radial surface 68 formed by the upper face of an outer radial collar 70 belonging to the control cuff 56.

The outer radial collar 70 is arranged, here, at the upper axial end of the control cuff 56.

Each spring 64 is wound around an axial screw 72 which passes through the outer radial collar 70 of the control cuff 56 and which is screwed at its threaded upper end 74 into the annular radial surface 66 of the supporting cuff 50.

Each screw 72 comprises, at its lower end, a head 76 which is housed axially in an associated notch 78 formed in the lower radial surface of the outer radial collar 70 of the control cuff 56.

It would be noted that the axial depth of the notch 78 is greater than the axial height of the head 76.

Each notch 78 is open radially outward, as may be seen particularly in FIG. 5.

Moreover, the outer radial collar 70 of the control cuff 56 comprises, in each notch 78, a slot 82 which is open radially outward and which allows the passage of the associated screw 72 through the outer radial collar 70.

Advantageously, the supporting cuff 50 comprises, at its upper axial end, an outer radial collar 84 which extends radially beyond the outside diameter of the control cuff 56.

The outer radial collar 84 of the supporting cuff 50 comprises a lower annular radial surface 86 which is intended to come to bear axially against an upper transverse surface 88 of the lower cap 44, in such a way that the outer radial collar 84 can be clamped axially between the upper cap 42 and the lower cap 44 of the cover 32 for the purpose of retaining the supporting cuff 50 axially on the cover 32.

The lower annular radial surface 86 comprises, here, a receptacle for an O-ring 90 aimed at ensuring leaktightness of contact between the outer radial collar 84 and the associated upper transverse surface 88 of the lower cap 44.

Advantageously, the drive means 62 of the control cuff 56 comprise a pneumatic or hydraulic jack which is provided with a piston 92 connected axially slideably to the control cuff 56 at least in the unlocking direction.

The piston 92 consists, here, of a tubular cuff which is coaxial and external with respect to the control cuff 56.

The piston 92 comprises, in its concave axial wall, an inner radial surface 94 which is oriented upward and which is intended to come to bear axially against an associated radial bearing surface 80 of the control cuff 56 in order to allow the control cuff 56 to be driven by the piston 92 when the piston 92 is displaced axially upward.

The radial bearing surface 80 is formed, here, by the lower radial surface of the outer radial collar 70 of the control cuff 56.

The piston 92 comprises, in its convex axial wall, an outer radial shoulder 96 which is oriented downward and which axially delimits, with a confronting radial bearing surface 98 arranged in the main body 46 of the nipple 22, a control chamber 100 of the piston 92.

The main body 46 of the nipple 22 comprises, here, a compressed-air supply duct 102 which is connected to a pressure source (not illustrated). Thus, the increasing pressure inside the control chamber 100 causes the upward sliding of the piston 92, thus bringing about the sliding of the control cuff 56 toward its unlocked position.

It would be noted that the axial stroke of the piston 92 and therefore of the control cuff 56 may be very short, for example of the order of 2.5 mm.

Advantageously, the supporting cuff 50, the balls 54, the control cuff 56, the springs 64, the screws 72 and the O-ring 90 are preassembled so as to form an interchangeable subassembly 101 which can thus be mounted in the lower cap 44 of the cover 32 in one operation.

For this purpose, the lower cap 44 comprises a cylindrical receptacle 103 which issues coaxially into the main body 46 of the nipple 22.

The interchangeable subassembly 101 is inserted axially into the receptacle 103 of the lower cap 44 from the top downward, until the outer radial collar 84 of the supporting cuff 50 comes to bear axially against the upper transverse surface 88 of the lower cap 44.

The interchangeable subassembly 101 is mounted, clamped axially between a bearing surface belonging to the upper cap 42 and the upper transverse surface 88 of the lower cap 44.

The connection means 28 which equip the nipple 22 according to the invention are now described.

The connection means 28 consist of a removable subassembly, called a cartridge 104, which has a substantially tubular shape coaxial with respect to the neck of the container 12.

The cartridge 104 comprises an axial portion, called a connection portion 106, which extends inside the pumping chamber 31 and which is provided with radial ports 108.

The pumping chamber 31 communicates with the interior of the cartridge 104 solely via the radial ports 108, the nominal dimensions of each port 108 being capable of preventing the diffusion toward the pumping chamber 31 of microwaves emitted inside the container 12 during treatment.

The cartridge 104 comprises a tubular main body 105, the lower axial end portion of which forms the connection portion 106 here.

According to the embodiment illustrated here, the connection portion 106 comprises two diametrically opposed windows 110 which are cut out in its axial wall.

Each window 110 is delimited circumferentially by two axial pillars 112, 114 and axially by two radial rims 116, 118.

Each window 110 is shut off by means of an attached axial wall element 120 in which the radial ports 108 are arranged.

The attached axial wall element 120 consists, here, of a perforated cuff 120 which is coaxial with respect to the connection portion 106 and is produced in one piece and which is inserted axially into the cartridge 104 so as to shut off the two windows 110.

The perforated cuff 120 comprises a multiplicity of identical radial ports 108 which extend over its entire axial surface.

The perforated cuff 120 is produced, for example, from metal.

It should be noted that the nominal dimension of the passage cross section of each radial port 108 and the radial thickness of the perforated cuff 120 are selected so as to prevent the diffusion toward the pumping circuit 30, most particularly toward the pumping chamber 31, of microwaves emitted inside the container 12 during treatment, while at the same time minimizing the pressure losses during vacuum pumping.

The cartridge 104 comprises a tubular spacer 122 which is force-fitted axially into the lower axial end 124 of the connection portion 106.

The spacer 122 is interposed axially between the lip 16 of the container 12 and the main body 105 of the cartridge 104.

The lower axial end 126 of the spacer 122 is provided with an annular seal 128 which is intended to make a leaktight connection between the cartridge 104 and the interior of the container 12.

Advantageously, when the cartridge 104 is mounted in the cover 32, the annular seal 128 comes to bear axially in a leaktight manner both against the inner shoulder 59 of the supporting cuff 50 and against the lip 16 of the container 12.

According to the embodiment illustrated here, the main body 105 of the cartridge 104 comprises an upper axial end portion, called a junction portion 130, which extends the connection portion 106 upward.

The junction portion 130 possesses a solid axial wall, and it is in leaktight contact at its upper free axial end with the body of an injector 132 intended for injecting acetylene into the container 12 during treatment.

The cartridge 104 comprises a cylindrical sleeve 134 which is arranged against the concave axial wall of the junction portion 130 and which extends substantially over the entire axial length of the junction portion 130.

According to the embodiment illustrated here, the cylindrical sleeve 134 is mounted in axial abutment against an associated radial surface 136 which is oriented downward and which is arranged in the vicinity of the upper axial end of the junction portion 130.

The perforated cuff 120 is retained axially inside the cartridge 104 at the top by the lower axial end of the cylindrical sleeve 134 and at the bottom by the upper axial end of the spacer 122.

The junction portion 130 is provided with an outer radial collar 138 which comes to bear axially against the upper transverse surface 140 of the cover 32 in a leaktight manner when the cartridge 104 is mounted in the cover 32.

The cartridge 104 is intended, here, to be inserted axially into a complementary cylindrical receptacle 142 of the cover 32 from the top downward.

The cylindrical receptacle 142 consists of a hole which is arranged in the upper cap 42 so as axially to confront the receptacle 103 intended for receiving the supporting cuff 50 of the gripping means 26.

Figure 6:
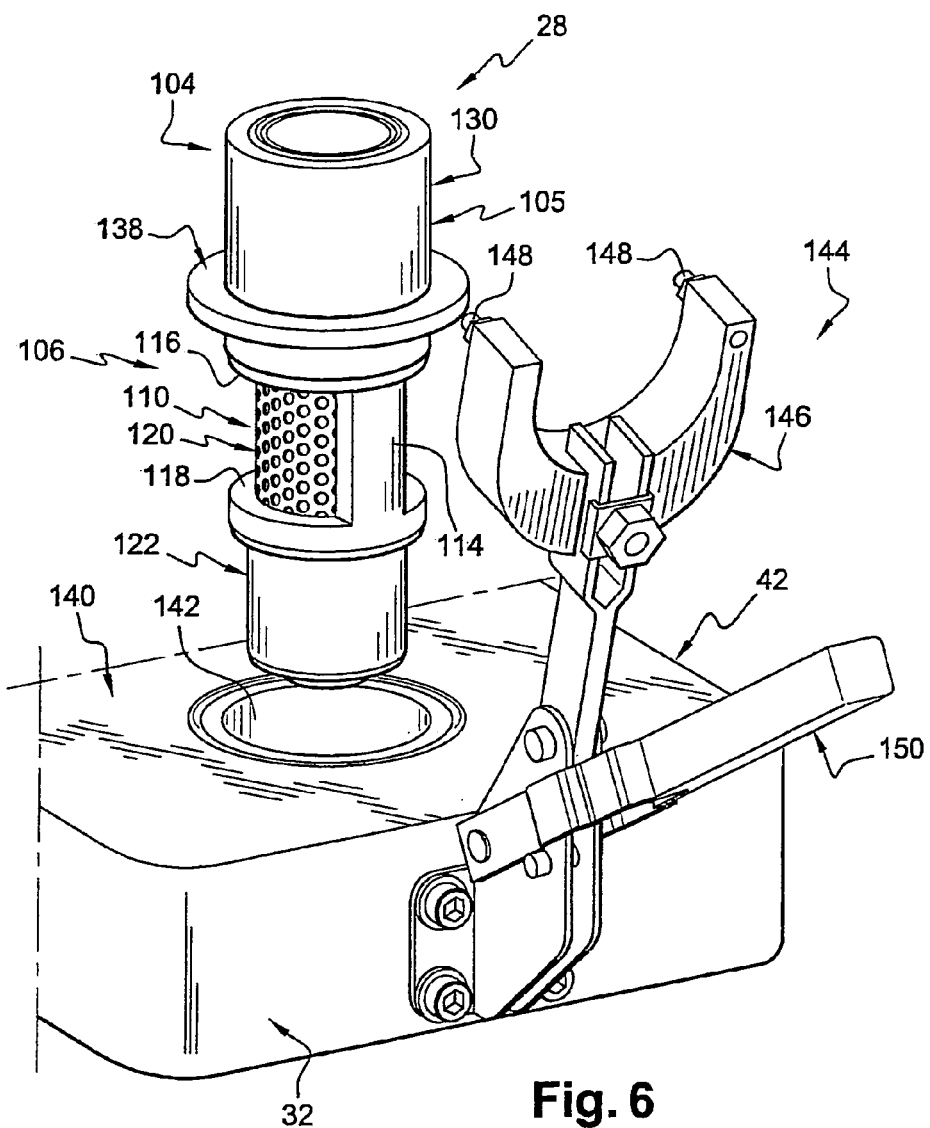
FIG. 6 is a perspective view which partially illustrates the upper cap of the cover before the fitting of the cartridge, the locking member of the cartridge occupying its release position.

The cover 32 is equipped with a locking member 144 which comprises a fork 146 mounted pivotably about a transverse axis A3 between an angular locked position, which is illustrated in FIG. 2, and an angular release position, which is illustrated in FIGS. 1 and 6.

The fork 146 has substantially a U-shape which extends in a transverse plane in the locked position and which delimits a notch substantially complementary to the outer shape of the junction portion 130 of the cartridge 104.

The lower transverse face of the fork 146 in the locked position is provided with two studs 148 which extend vertically downward and which form respectively at their lower axial ends two transverse surfaces intended to come to bear axially against the upper radial face of the outer radial collar 138 of the junction portion 130.

The studs 148 are arranged, here, in the vicinity of the free ends of the fork 146.

Preferably, each stud 148 consists of a screw which is screwed into the lower transverse face of the fork 146 and which comprises a head forming a bearing surface.

Thus, it is possible to set the height of the bearing surfaces of the fork 146 on the outer radial collar 138 accurately by screwing to a greater or lesser extent each screw which forms a stud 148.

The locking member 144 is equipped with a lever 150 which controls the pivoting of the fork 146 between its two angular positions.

The gripping means 26 and the connection means 28 equipping the treatment machine 10 according to the invention function as follows.

As explained above, the interchangeable subassembly 101 is formed by assembling the control cuff 56 on the supporting cuff 50 together with the balls 54, the springs 64 and the screws 72.

Similarly, the elements forming the cartridge 104, that is to say its main body 105, the cylindrical sleeve 134, the perforated cuff 120, the spacer 122 and the seals equipping it are preassembled.

The lower cap 44 of the cover 32 is open by causing it to pivot downward about its axis A2, so as to allow the axial insertion of the interchangeable subassembly 101 into the associated receptacle 103 from the top downward, as illustrated in FIGS. 1 and 5.

This operation is carried out when the cover 32 occupies its high transfer position.

The lower cap 44 can then be reclosed by causing it to pivot upward against the upper cap 42, so that the interchangeable subassembly 101 is then clamped axially between the lower cap 44 and the upper cap 42, as illustrated in FIGS. 2, 3 and 4.

With the locking member 144 occupying its release position, the cartridge 104 is inserted axially into the associated receptacle 142 from the top downward, until the outer radial collar 138 of the junction portion 130 comes to bear axially against the upper transverse surface 140 of the cover 32 of the upper cap 42.

Action on the control lever 150 subsequently causes the fork 146 to pivot toward its locked position, as illustrated in FIG. 2, thus blocking the cartridge 104 axially in its mounted position.

It should be noted that, in the mounted position of the cartridge 104, the annular seal 128 equipping the lower axial end 126 of the spacer 122 comes to bear axially in a leaktight manner against the inner shoulder 59 of the supporting cuff 50 of the interchangeable subassembly 101.

The body of the injector 132 can then be displaced axially downward so as to come to bear axially in a leaktight manner against the upper axial end of the junction portion 130 of the cartridge 104, as illustrated in FIG. 4.

It should be noted that, to simplify the illustration, the elements of the injector 132 have not been illustrated in the other figures.

At this stage, with the gripping means 26 and the connection means 28 being mounted on the cover 32, they are ready to function.

The phase of gripping a container 12 proceeds as follows.

The container 12 to be seized is placed axially under the nipple 22, for example by means of a feed wheel (not illustrated), as illustrated in FIG. 3.

The control cuff 56 is controlled from its gripping position as far as its release position, as illustrated in FIG. 3, by means of the piston 92, in order to allow the insertion of the neck 14 of the container 12 into the supporting cuff 50.

Control means (not illustrated) cause the axial downward sliding of the cover 32 until the neck 14 of the container 12 is received axially inside the cylindrical lower axial end portion 53 of the supporting cuff 50.

With the pressure in the control chamber 100 of the piston 92 being relaxed, the control cuff 56 is driven toward its locked position under the action of the springs 64, thus stressing the balls 54 radially toward their gripping position, against the axial wall of the neck 14 of the container 12, as illustrated in FIG. 4.

The radial bearing of the balls 54 against the first outer radial collar 18 stresses the container 12 slightly upward, so that the lip 16 comes to bear axially in a leaktight manner well against the annular seal 128 equipping the spacer 122.

At this stage, the container 12 is seized by the gripping means 26, thus allowing the cover 32 to continue its axial downward sliding, so as to introduce the container 12 axially into the enclosure 34 in order to make it possible to treat it.

The cover 32 descends as far as its axial treatment position, illustrated in FIG. 4, in which the nipple 22 closes the treatment enclosure 34 in a leaktight manner.

In the axial treatment position, the vacuum pumping of the interior of the container 1.2 can begin, as can the treatment of the container 12.

After the treatment of the container 12, the cover 32 is controlled so as to slide toward its high transfer position, and the control cuff 56 is controlled into its release position, to allow the treated container 12 to be discharged from the machine.

The gripping means 26 and the cover 32 can then be controlled so as to seize a new container 12 to be treated, in the same way as described above.

During the treatment of the container 12, the microwaves emitted inside the treatment enclosure 34 cause deposits of carbon on the inner axial faces of the cartridge 104.

By virtue of the connection portion 106 and of the perforated cuff 120, the microwave field is confined inside the cartridge 104, thus preventing carbon from being deposited in the pumping chamber 31.

After the treatment of a specific number of containers 12, the cartridge 104 can be demounted so as to make it possible to clean surfaces which have undergone repeated deposits of carbon.

In the machine 10 according to the invention, the demounting of the cartridge 104 is facilitated, since it is sufficient to cause the body of the injector 132 to slide axially upward, the latter also requiring cleaning, and then to cause the fork 146 to pivot toward its release position. The cartridge 104 can then be removed manually, without tools, and be replaced just as easily.

Advantageously, a replacement cartridge 104 may be provided so as to make it possible to clean the used cartridge 104 in parallel during the functioning of the machine 10.

It should be noted that the carbon deposit inside the cartridge 104 decreases exponentially upward. Consequently, the carbon deposit is concentrated mainly on the concave axial surface of the spacer 122.

The cleaning of the cartridge 104 can thus be reduced to cleaning the spacer 122 and its annular seal 128.

The gripping means 26 according to the invention have the advantage of being arranged outside the microwave field so that they do not experience any carbon deposit.

Since the drive means 62 of the control cuff 56 are mounted on the main body 46 of the nipple 22, which is itself fastened to the lower cap 44 of the cover 32, the interchangeable subassembly 101 can be demounted without the need to demount the drive means 62.

This makes it possible to provide interchangeable subassemblies 101 as a function of the shape of the neck 14 of the container 12, without the need to modify the drive means 62 and/or the main body 46 of the nipple 22.

Moreover, the operation of changing the interchangeable subassembly 101 is particularly simple since it is sufficient to cause the lower cap 44 of the cover 32 to tilt downward.

The gripping means 26 according to the invention make it easier to personalize the treatment station 11 as a function of the shape of the containers 12 to be treated.

It should be noted that the nipple 22 is provided with a plurality of seals, which have not all been designated by reference numerals, in order to ensure vacuum pumping in the container 12 and the leaktight closing of the treatment enclosure 34.

Preferably, a proximity sensor (not illustrated) arranged on the cover 32 detects the moments when the control cuff 56 has to be controlled into the gripping or release position. This proximity sensor may be connected electrically to a solenoid valve which controls the pressure in the control chamber 100, thus making it possible to control the gripping means 26 directly by means of the proximity sensor, without the need to go through the control unit of the treatment station 11 or of the machine 10.

By the gripping means 26 according to the invention, it is not necessary to apply a holding force in order to keep the control cuff 56 in the locked position, since this position corresponds to a stable position of rest due to the action of the springs 64.

Moreover, in the machine 10 according to the invention, it is not necessary to exert a force on the container 12 in order to release it or to seize it.

The invention claimed is:

1. A machine (10) for the treatment of containers (12) by the depositing of a barrier-forming internal coating by means of a microwave plasma, said machine comprising:
   a treatment enclosure (34),
   at least one treatment station (11) for a container (12) provided with a neck (14), each said treatment station (11) comprising a nipple (22) which comprises gripping means (26) for seizing the container (12) externally by its neck (14) and connection means (28) for connecting the interior of the container (12) to a vacuum-pumping circuit (30) in a leaktight manner,
   the nipple (22) being mounted slideably along a substantially vertical axis (A1) with respect to the treatment enclosure (34) between an axial transfer position and an axial treatment position, so as to allow the axial insertion of the container (12) into the treatment enclosure (34) via a corresponding aperture (38),
   the nipple (22) comprising an annular closing portion (40) which comes to bear axially against a corresponding portion (36) of the treatment enclosure (34) in a leaktight manner in order to close said aperture (38) of the latter,
   the gripping means (26) comprising a tubular supporting cuff (50) which is coaxial with respect to the neck (14) of the container (12) and is fixed in relation to the nipple (22) and which is provided with a series of open-ended radial drillholes (52) having balls (54) therein that are movable radially between an inner gripping position, in which the balls (54) cooperate with the neck (14) in order to seize the container (12), and an outer release position,
   the gripping means (26) comprising a tubular control cuff (56) which is coaxial and external with respect to the supporting cuff (50) and which is mounted axially slideably with respect to the supporting cuff (50) between a locked axial position, in which a frustoconical bearing surface (58) on a concave axial wall of the control cuff (56) cooperates with the balls (54) in order to stress them radially toward their gripping position, and an unlocked axial position, in which the balls (54) are free to be displaced toward their release position, and
   the nipple (22) comprising controlled drive means (62) for causing the axial sliding of the control cuff (56) toward at least one of its two specific axial positions.

2. The machine (10) as claimed in claim 1, wherein the gripping means (26) comprise at least one elastic return element (64) which stresses the control cuff (56) toward its locked position, and wherein the drive means (62) cause the sliding of the control cuff (56) from its locked position toward its unlocked position counter to the elastic return element (64).

3. The machine (10) as claimed in claim 2, wherein the return element (64) is interposed axially between the control cuff (56) and the supporting cuff (50).

4. The machine (10) as claimed in claim 1, wherein the drive means (62) comprise a pneumatic or hydraulic jack which is provided with a piston (92) connected axially slideably to the control cuff (56), at least in the unlocking direction.

5. The machine (10) as claimed in claim 4, wherein the piston (92) comprises a tubular cuff which is coaxial and external with respect to the control cuff (56) and a radial surface (94) bearing axially against an associated radial bearing surface (80) of the control cuff (56).

6. The machine (10) as claimed in claim 1, wherein the control cuff (56) is assembled on the supporting cuff (50) provided with the balls (54), so as to form an interchangeable subassembly (101).

7. The machine (10) as claimed in claim 6, wherein the nipple (22) is carried by a cover (32) which is mounted axially slideably with respect to the treatment enclosure (34) and which comprises an upper cap (42) and a lower cap (44), and wherein the supporting cuff (50) comprises, at its axial end opposite the neck (14), an outer radial collar (84) which is clamped axially between the upper cap (42) and the lower cap (44) of the cover (32), so as to retain the interchangeable subassembly (101) on the cover.

8. The machine (10) as claimed in claim 1, wherein the leaktight connection means (28) comprise a substantially tubular cartridge (104) which is coaxial with respect to the neck (14) of the container (12) and which is provided, at one of its axial ends, with an annular seal (128), and wherein a concave axial wall of the supporting cuff (50) comprises a shoulder (59) that bears axially against the annular seal (128).

9. The machine (10) as claimed in claim 8, wherein the neck (14) of the container (12) comprises an outer radial collar (18), and , wherein when the balls (54) are displaced radially toward their gripping position, they cooperate with the outer radial collar (18), so as to stress the container (12) axially toward the annular seal (128).

10. The machine (10) as claimed in claim 9, wherein the outer radial collar (18) comprises a tamper-proof ring of the container.

11. The machine (10) as claimed in claim 2, wherein the drive means (62) comprise a pneumatic or hydraulic jack which is provided with a piston (92) connected axially slideably to the control cuff (56), at least in the unlocking direction.

12. The machine (10) as claimed in claim 3, wherein the drive means (62) comprise a pneumatic or hydraulic jack which is provided with a piston (92) connected axially slideably to the control cuff (56), at least in the unlocking direction.

* * * * *